(12) United States Patent
Kerger et al.

(10) Patent No.: US 11,588,319 B2
(45) Date of Patent: Feb. 21, 2023

(54) DIFFERENTIAL PROTECTION METHOD, DIFFERENTIAL PROTECTION DEVICE, AND DIFFERENTIAL PROTECTION SYSTEM

(71) Applicant: SIEMENS AKTIENGESELLSCHAFT, Munich (DE)

(72) Inventors: Torsten Kerger, Schoenwalde-Glien (DE); Robert Matussek, Berlin (DE); Matthias Gross, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 178 days.

(21) Appl. No.: 17/189,531

(22) Filed: Mar. 2, 2021

(65) Prior Publication Data

US 2021/0273442 A1 Sep. 2, 2021

(30) Foreign Application Priority Data

Mar. 2, 2020 (EP) ..................................... 20160390

(51) Int. Cl.
| | |
|---|---|
| H02H 3/00 | (2006.01) |
| H02H 3/26 | (2006.01) |
| G01R 31/08 | (2020.01) |
| H02H 1/00 | (2006.01) |

(52) U.S. Cl.
CPC ........... *H02H 3/265* (2013.01); *G01R 31/085* (2013.01); *H02H 1/0007* (2013.01)

(58) Field of Classification Search
CPC ..... H02H 3/265; H02H 1/0007; G01R 31/085

USPC .......................................................... 361/85
See application file for complete search history.

(56) References Cited

U.S. PATENT DOCUMENTS

| | | | |
|---|---|---|---|
| 8,154,836 B2 | 4/2012 | Kasztenny et al. | |
| 8,559,146 B2 | 10/2013 | Kasztenny et al. | |
| 10,429,429 B2 | 10/2019 | Kerger et al. | |
| 10,749,335 B2 | 8/2020 | Westwood et al. | |

(Continued)

FOREIGN PATENT DOCUMENTS

| | | |
|---|---|---|
| EP | 3136528 A1 | 3/2017 |
| JP | 3615179 B2 | 1/2005 |
| JP | 5434309 B2 | 3/2014 |

*Primary Examiner* — Jared Fureman
*Assistant Examiner* — Lucy M Thomas
(74) *Attorney, Agent, or Firm* — Laurence A. Greenberg; Werner H. Stemer; Ralphe E. Locher

(57) ABSTRACT

A differential protection method for monitoring a line of a power grid. Current phasor measured values are captured at the ends of the line and transmitted to an evaluation device which is used to form a differential current value with current phasor measured values temporally allocated to one another. Time delay information indicating the time delay between local timers of the measuring devices is used for the temporal allocation of the current phasor measured values captured at different ends, and a fault signal indicating a fault affecting the line is generated if the differential current value exceeds a predefined threshold value. The reliability of the time synchronization is further increased by forming a quotient of the current phasor measured values to form an asymmetry variable, that is used to check a transit time difference of messages transmitted via the communication connection in different directions.

12 Claims, 7 Drawing Sheets

(56) References Cited

U.S. PATENT DOCUMENTS

2007/0070565 A1* 3/2007 Benmouyal ............ H02H 3/283
                                                         361/62
2012/0147941 A1   6/2012 Su et al.
2013/0181755 A1   7/2013 Li et al.
2018/0292448 A1  10/2018 Schweitzer, III et al.

* cited by examiner

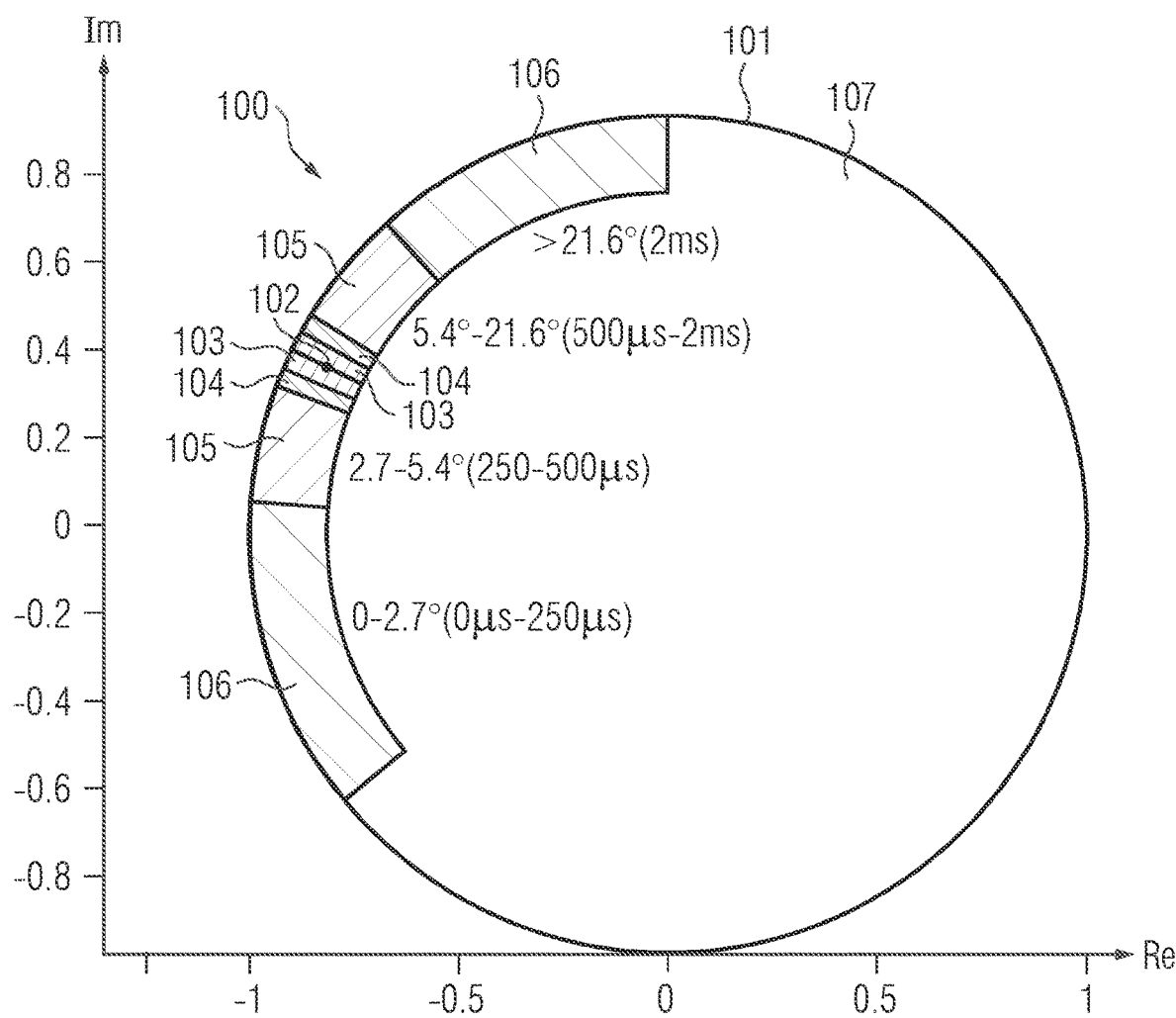

DIFFERENTIAL PROTECTION METHOD, DIFFERENTIAL PROTECTION DEVICE, AND DIFFERENTIAL PROTECTION SYSTEM

CROSS-REFERENCE TO RELATED APPLICATION

This application claims the priority, under 35 U.S.C. § 119, of European patent application EP 20160390.9, filed Mar. 2, 2020; the prior application is herewith incorporated by reference in its entirety.

BACKGROUND OF THE INVENTION

Field of the Invention

The invention relates to a differential protection method for monitoring a line of a power grid, in which current phasor measured values are captured in each case with measuring devices at the ends of the line. The values indicate the amplitude and phase angle of a phase current flowing at the respective end of the line. The measuring devices have local timers and allocate a timestamp to the current phasor measured values indicating the time of their capture. At least the current phasor measured values captured at one end are transmitted via a communication connection to an evaluation device, a differential current value is formed through vectorial addition by means of the evaluation device with current phasor measured values temporally allocated to one another, wherein time delay information indicating the time delay between the local timers of the measuring devices is used for the temporal allocation of the current phasor measured values captured at different ends, wherein the time delay information is determined using a transit-time-based time synchronization method, and a fault signal indicating a fault affecting the line is generated if the differential current value exceeds a predefined threshold value.

The invention also relates to a corresponding differential protection device for carrying out a differential protection method of this type, and to a differential protection system with at least two differential protection devices of this type.

A current differential protection method (referred to below for the sake of simplicity as a "differential protection method") is often used to monitor high-voltage and medium-voltage lines, such as overhead lines or cables, of power grids. The current flowing at the ends of the monitored line is captured in this case in the form of current phasor measured values providing information relating to the amplitude and phase angle of the current and is fed to a differential protection device. The differential protection device forms differential current values from the current phasor measured values through vectorial addition, said differential current values being used to evaluate the operational situation of the monitored primary component. To do this, the differential current values are normally determined through vectorial addition and subsequent absolute value formation from the current phasor measured values. In the fault-free case, the differential current values are in a range close to zero according to Kirchhoff's node rule, since, in simplified terms, the current flowing into the component flows completely out of it again. This also applies to load currents flowing through the monitored line or external faults, that is to say faults which are outside the monitored line and whose fault currents flow through the line. Conversely, if differential current values arise which exceed a non-zero threshold value, these indicate a fault-affected operating condition, e.g. an internal short circuit. In this case, the fault current that is present must be interrupted by opening switching devices, e.g. circuit breakers, which limit the line. For this purpose, the differential protection device generates a corresponding fault signal, as a result of which the generation of a switching signal for the respective switching device can be instigated.

However, in differential protection systems, influences which result in apparent differential current values not equal to zero may occur even during fault-free operation. These may be, for example, saturation phenomena of the current transformers, capacitive charging currents or asynchronous communication via a communication connection. For this reason, a response value of zero cannot be accepted for the assessment of the differential current values.

In the case of a line with ends that are located far apart, for example a line having a length of several kilometers, the current phasor measured values must be transmitted over a longer route. In such a case, a separate differential protection device is normally disposed at each of the ends of the line, forming the respective differential current value from its own (locally captured) current phasor measured values and the current phasor measured values received from the other end of the line. In the case of a line with a plurality of ends, such as a branched line, current phasor measured values are additionally required from each of the ends in order to be able to carry out the differential protection method correctly. To do this, the current phasor measured values captured locally at the respective measuring points must be transmitted between the individual differential protection devices.

Current phasor measured values from at least two different measuring points at the respective ends of the monitored line are consequently required in order to evaluate the operational situation of the line. In the case of existing differential protection systems, the current phasor measured values are frequently transmitted via a hard-wired point-to-point connection (e.g. copper or optical fiber lines), as a result of which a deterministic transmission is achieved, i.e. the transmission time of the measured values is mainly dependent on the transmission route and the transmission type, and it is also substantially constant.

In more recent differential protection systems, a tendency has now developed to transmit the current phasor measured values via a communication network, e.g. a telecommunication network or a data communication network based on the IP protocol, rather than via a hard-wired connection. This offers the advantage of a more economical communication infrastructure. Furthermore, communication networks are often already present in the vicinity of primary electrical components, for example between so-called substations of a power grid, and can be used without additional cost for the transmission of the current measured values.

However, the advantage of the deterministic transmission time is often lost through the use of communication networks for the transmission of the current measured values, so that a problem arises in terms of the allocation of the respectively associated current phasor measured values. The local and the received measured values must in fact be temporally aligned in such a way that the phasor measured values captured at the same time are compared in each case with one another in the differential value formation. If, as is possible in a deterministic communication system, for example, the respective transmission time of the current phasor measured values is known, the respective time of the measured value capture can be determined from the reception time of the measurement data in the local differential protection device and the known transmission time. Conversely, in communication systems which are not deterministic in terms of the transmission paths and/or transit times of messages, for example telecommunication networks or IP or Ethernet networks, problems arise, for example, because the transmission time is not constant or differences occur in the transmission time in the forward and return direction.

An over-function of the differential protection device can be caused by such uncertainties in the temporal alignment of the respective current phasor measured values, since a differential current value which specifies a fault relating to the primary component, but which does not actually exist at all, is formed in the addition with the correct algebraic sign of non-associated phasor measured values. This may result in inadvertent tripping responses which impair the proper operation of the power grid.

Since it is primarily important for a reliable mode of operation of a differential protection method that the current phasor measured values at the line ends be determined in each case at the same time, the measuring devices which are used to capture the current phasor measured values at the line ends now normally have local timers or clocks which emit a time signal which is used for the timestamping of the captured current phasor measured values. In order to be able, for example, to determine the phasor measured values in each case at the same times, it is necessary to temporally synchronize these local timers with one another so that the time delay between the local timers is adjusted to zero. This could be achieved, for example, by synchronizing the local timers with one another via an external timer system, for example, by means of the time signal contained in the GPS signal. For this purpose, however, special receiving systems, such as GPS receivers, are necessary, which increase the price of the device. The antennas of GPS receivers furthermore require an unobstructed line of sight to the satellites, so that corresponding structural conditions must prevail or be created.

Without external means such as GPS receivers, the local timers these days are frequently synchronized using the transit times of messages transmitted between the measuring devices at the line ends (also referred to as "transit-time-based time synchronization" below). One example of a transit-time-based method is also referred to as the "ping-pong method." In this case, the transmission and reception timestamps of the transmitted messages are exchanged between the respective measuring devices. The time delay ("offset") between the local timers is obtained as the result of this method. It is thus possible either to convert the time information of the received measured values of the respective other measuring device contained in the timestamp of the message into their own time, or to adjust the time delay to zero by adjusting the time of one of the timers. Another example is a method in which the absolute time present at a central timer is distributed to the individual measuring devices via messages. The transit time via the communication connections is also relevant in this case. For example, such time synchronization can be carried out according to the IEEE 1588 standard.

However, a fundamental requirement for this method for determining the time delay between the timers is that the transit times of the messages must be the same during transmission on the forward path and the return path. In this context, this is referred to as the guarantee of symmetrical transit times.

Communication networks normally guarantee a high data quality, availability and symmetrical transit times. Nevertheless, it may be the case that the requirement for symmetrical transit times in a communication network cannot be completely met. It has been observed, for example, in the case of a communication path of the transmitted messages passing through a plurality of communication networks or a plurality of subnetworks of a communication network, the transit times may change gradually or may change abruptly in large jumps. It has furthermore been observed that the symmetry of the transit times changes when the course of the communication path changes and the originally present transit times do not prevail on the return to the original communication path.

If asymmetrical transit times occur, i.e. the transit times of the messages on the forward path and the return path are not the same, the received current phasor measured values cannot be temporally allocated correctly to their own current phasor measured values. A so-called "angular error" $\Delta\Theta$ occurs.

Half of the time delay between emission and return is included in asynchronous communication according to equation 1:

$$\frac{\Delta T}{2} = \frac{t_{S1} - t_{S2}}{2} \qquad (1)$$

For a grid frequency f, the angular error $\Delta\Theta$ is:

$$\Delta\theta = 2\pi f \frac{\Delta T}{2} = \pi f \Delta T \qquad (2)$$

In a grid having a grid frequency of f=60 Hz, a transit time difference of 1 ms therefore causes an angular rotation of 10.8° (9° for f=50 Hz). The resulting differential current is determined according to a simple geometrical equation:

$$I_{diff} = 2 \cdot I \cdot \sin\left(\frac{\Delta\theta}{2}\right) \qquad (3)$$

and, for f=60 Hz, is approximately 19% (16% for f=50 Hz) of the current I flowing through.

The respective differential protection device would consequently determine a differential current value which is not present in reality in relation to the monitored line. If this differential current value exceeds a specific threshold value, this results in an inadvertent shutdown of the monitored line.

U.S. Pat. No. 8,154,836 B2 discloses a differential protection method in which, in a differential protection system with more than two ends, the local timers are synchronized via an external synchronization method, e.g. a GPS signal, or a line-based synchronization method. A combined use of the different methods is also possible. If an external time signal fails, it is possible to switch over to the line-based synchronization method under certain conditions so that the timers can still be kept synchronous.

European published patent application EP 3136528 A1 also discloses a method in which a triangle is spanned with the measured current phasor values and a line-specific parameter, e.g. a charging current value, and a check is carried out in order to determine whether a resulting phase angle corresponds to the time delay (offset) used.

An attempt could indeed be made to compensate for incorrect time synchronization by means of more insensitive adjustment of the differential protection by adding a correction value dependent on the nominal current to a stabilization value, for example. However, since such stabilization operates with scalar variables, but asymmetry of the data communication causes a phase error, the stabilization covers this error only inadequately. In addition, stabilization against the error can be carried out only if the asymmetry is actually known, which is generally not the case. The differential protection therefore becomes merely more insensitive as a result of this correction value.

BRIEF SUMMARY OF THE INVENTION

It is accordingly an object of the invention to provide a differential protection method, device, and system, which overcome the above-mentioned disadvantages of the heretofore-known devices and methods of this general type and which further increases the reliability of the time synchronization of the internal timers in a differential protection system.

With the above and other objects in view there is provided, in accordance with the invention, a differential protection method for monitoring a line of a power grid, the method comprising:

capturing current phasor measured values with measuring devices at respective ends of the line, the measured values indicating an amplitude and a phase angle of a phase current flowing at a respective end of the line, wherein the measuring devices include local timers and allocate a timestamp to the current phasor measured values indicating a time of a capture of the current phasor measure values;

transmitting at least the current phasor measured values captured at one end via a communication connection to an evaluation device;

forming a differential current value through vectorial addition by the evaluation device with current phasor measured values temporally allocated to one another;

determining time delay information indicating a time delay between the local timers of the measuring devices with a transit-time-based time synchronization method and using the time delay information for temporally allocating the current phasor measured values captured at different ends of the line;

forming a quotient of the current phasor measured values temporally allocated to one another to form an asymmetry variable, and using the asymmetry variable to check a transit time difference of messages transmitted via the communication connection, the transit time difference arising on account of transmission times that are different depending on the direction; and generating a fault signal indicating a fault affecting the line if the differential current value exceeds a predefined threshold value.

In other words, the objects of the invention are achieved by a method in which a quotient of the current phasor measured values temporally allocated to one another is formed with the formation of an asymmetry variable, wherein the asymmetry variable is used to check a transit time difference of messages transmitted via the communication connection, which transit time difference arises on account of transmission times which are different depending on the direction.

As a result of forming the quotient of the current phasor measurement variables, a phase error, in particular, becomes noticeable during the analysis and can therefore be evaluated in a comparatively simple manner. Since the phase differences can therefore be accurately determined, faulty communication can be directly inferred. The asymmetry in milliseconds can be determined from the phasor rotation in degrees and the grid frequency. It is therefore possible to dispense with more insensitive adjustment of the differential protection.

One advantageous embodiment of the differential protection method according to the invention provides for the current phasor measured value with the smaller absolute value to be divided by the current phasor measured value with the larger absolute value in order to form the quotient.

This makes it possible to achieve the situation in which the resulting value of the asymmetry variable does not exceed the value 1. This makes it possible to simplify the evaluation of the asymmetry variable.

In this context, provision may be made for the asymmetry variable to be formed only when the quotient of the current phasor measured values exceeds a predefined minimum value.

This makes it possible to reliably distinguish between a differential current value produced by an incorrect transit time calculation and a differential current value caused by an actual fault. The predefined minimum value may be 0.56, for example.

In addition, according to a further advantageous embodiment of the differential protection method according to the invention, provision may be made for the position of the asymmetry variable in a complex number plane to be analyzed and for the presence of a transit time difference to be inferred on the basis of the position.

In this case, a unit circle can be placed around the zero point in the complex number plane, for example. The position of the asymmetry variable within the unit circle can be evaluated in order to detect transit time differences.

Specifically, in this context, provision may be made for a fault message to be generated on the basis of the distance between the position of the asymmetry variable and a reference operating point.

In the ideal fault-free case, the reference operating point is at −1, that is to say on the left-hand point of intersection of the unit circle with the imaginary axis of the complex number plane. A transit time change which, as explained, is expressed by an angular displacement causes migration of the asymmetry variable on the circumference of the unit circle. In this case, the asymmetry variable moves away from the reference operating point. In this case, the distance can be measured in degrees, for example. A fault message can be generated depending on the distance. The content of the fault message can be dismissed in a stepped manner; a suggestion can be made in the case of only short distances from the reference operating point, whereas a warning (possibly of different intensity) can be given in the case of greater distances.

In this context, provision may also be made for the generation of the fault signal indicating a fault affecting the line to be blocked if the distance between the position of the asymmetry variable and the reference operating point exceeds a maximum distance.

The differential protection function can therefore be blocked if such a high transit time difference has been detected that a reliable method of operation of the differential protection is no longer ensured.

A further advantageous embodiment of the differential protection method according to the invention also provides for the position of the reference operating point to be determined on the basis of a capacitive charging current of the line.

This is because a significant charging current can affect the position of the reference operating point in the fault-free case. The capacitive charging current should therefore be advantageously taken into account when determining the reference operating point so that the correct mode of operation of the detection of transit time differences is ensured.

In addition, provision may be made for the asymmetry variable to be formed only when the absolute value of at least one of the current phasor measured values exceeds the capacitive charging current of the line by a predefined factor.

This is because, in the extreme case, a significant capacitive charging current can shift the reference operating point even in the direction of the origin or the right-hand side of the unit circle. It would therefore no longer be possible to reliably distinguish between a transit time difference and an actual fault. The ratio of the load current indicated by the current phasor measured values and the capacitive charging current should therefore be used to assess a permitted operating range of the transit time difference detection. The factor may be 2.3, for example.

In addition, according to a further advantageous embodiment of the differential protection method according to the invention, provision is made for the asymmetry variable to be formed only if the absolute values of the current phasor measured values are below a threshold dependent on the nominal current of the power grid.

In the case of a very high load current, a capacitive charging current can no longer be determined, with the result that the correct method of operation of the transit time difference detection is no longer ensured. The operating range is therefore limited on the basis of the load current. For example, the threshold to be used may be 1.5 In.

Finally, according to a further advantageous embodiment of the differential protection method according to the invention, provision may be made for an area to be defined in the complex number plane, within which the position of the symmetry variable is permitted, and for the check of the transit time difference to be suspended if the asymmetry variable is outside the defined area.

This makes it possible to virtually define an operating range for the transit time difference detection, with the result that the function is blocked in the event of deviations therefrom.

The aforementioned object is also achieved by a differential protection device for monitoring a line of a power grid, comprising a measuring device which has a local timer and is configured to capture current phasor measured values at one end of the line, said values indicating the amplitude and phase angle of a phase current flowing at the end of the line, and to allocate a timestamp to the current phasor measured values indicating the time of their capture, comprising a communication device which is configured to exchange current phasor measured values via a communication connection with another differential protection device, and comprising an evaluation device which is configured to form a differential current value with its own current phasor measured values temporally allocated to one another on the one hand, and current phasor measured values received from the other differential protection device on the other hand, through vectorial addition, wherein time delay information indicating the time delay between the local timers of the measuring devices of the differential protection devices is used for the temporal allocation of the current phasor measured values captured at different ends, wherein the time delay information is determined using a transit-time-based time synchronization method, and to generate a fault signal indicating a fault affecting the line if the differential current value exceeds a predefined threshold value.

It is provided according to the invention that the differential protection device is configured to form a quotient of the current phasor measured values temporally allocated to one another with the formation of an asymmetry variable, wherein the asymmetry variable is used to check a transit time difference of messages transmitted via the communication connection, which transit time difference arises on account of transmission times which are different depending on the direction.

Finally, the object is also achieved by a differential protection system for monitoring a line of a power grid, comprising at least two differential protection devices, wherein a differential protection device is provided at each end of the line, and comprising a communication connection to which the individual differential protection devices are connected in order to transmit current phasor measured values, wherein each of the differential protection devices comprises a measuring device which has a local timer and is configured to capture current phasor measured values at a respective end of the line, said values indicating the amplitude and phase angle of a phase current flowing at the end of the line, and to allocate a timestamp to the current measured values indicating the time of their capture, wherein each of the differential protection devices comprises a communication device which is configured to exchange current phasor measured values via the communication connection with the respective other differential protection device, and wherein at least one of the differential protection devices comprises an evaluation device which is configured to form a differential current value with its own current phasor measured values temporally allocated to one another on the one hand, and current phasor measured values received from the other differential protection device on the other hand, through addition with the correct algebraic sign, wherein time delay information indicating the time delay between the local timers of the measuring devices of the differential protection devices is used for the temporal allocation of the current phasor measured values measured at different ends, wherein the time delay information is determined using a transit-time-based time synchronization method, and to generate a fault signal indicating a fault affecting the line if the differential current value exceeds a predefined threshold value.

In this respect, it is provided according to the invention that the at least one of the differential protection devices is configured to form a quotient of the current phasor measured values temporally allocated to one another with the formation of an asymmetry variable, wherein the asymmetry variable is used to check a transit time difference of messages transmitted via the communication connection, which transit time difference arises on account of transmission times which are different depending on the direction.

All the statements made above and below in relation to the differential protection method according to the invention apply to the differential protection device according to the invention and the differential protection system according to the invention and vice versa in a corresponding manner; in particular, the differential protection device according to the invention and the differential protection system according to the invention are configured to carry out the differential protection method according to the invention in any embodiment or a combination of any embodiments. In respect of the advantages of the differential protection device according to the invention and the differential protection system according to the invention, reference is also made to the advantages described in relation to the differential protection method according to the invention.

Other features which are considered as characteristic for the invention are set forth in the appended claims.

Although the invention is illustrated and described herein as embodied in differential protection method, differential protection device, and differential protection system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 11 shows a third graph having different regions for explaining the evaluation of the asymmetry variable.

DETAILED DESCRIPTION OF THE INVENTION

Figure 1:
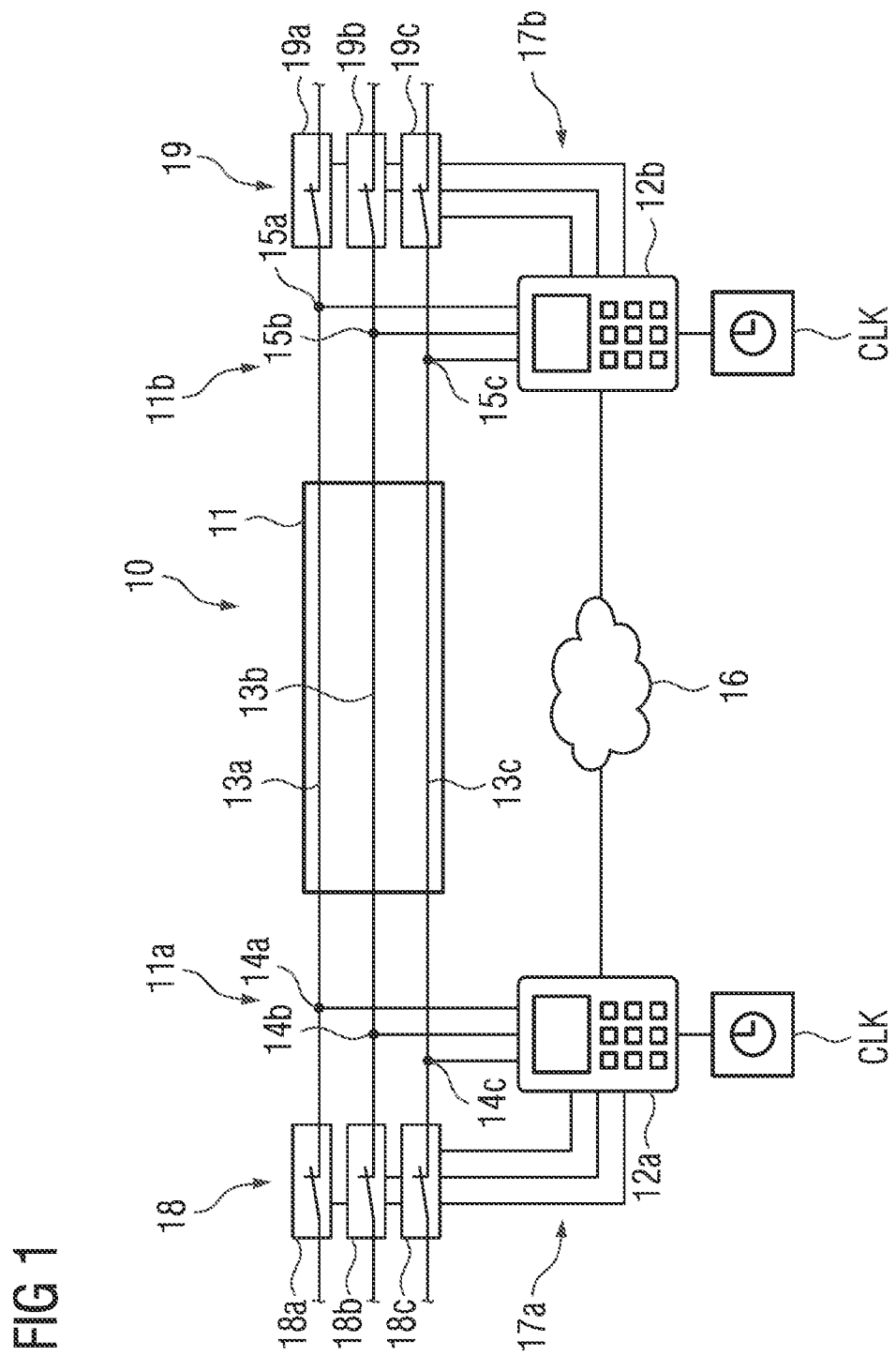
FIG. 1 shows a schematic view of a differential protection system for monitoring a line of a power grid.

Referring now to the figures of the drawing in detail and first, in particular, to FIG. 1 thereof, there is shown a part 10 of a power grid. The part 10 comprises a three-phase line 11 which may be designed, for example, as an overhead line or as a cable. The line 11 is monitored at its first end 11a by way of a first differential protection device 12a and at its second end 11b by way of a second differential protection device 12b for faults occurring on the line, such as, for example, short circuits. For this purpose, current signals are captured for each phase 13a, 13b, 13c of the line 11 with first current transformers 14a-c at a first measuring point at the first end 11a of the line 11 and second current transformers 15a-c at a second measuring point at the second end 11b of the primary component 11 and are fed to a respective measuring device of the differential protection devices 12a, 12b. Current phasor measured values which provide an indication of the amplitude and phase angle of the current signal at the time of capture are generated from the analog current signals. The current phasor measured values, including an A/D conversion, can be generated in the measuring device of the respective differential protection device 12a, 12b, in the current transformers themselves or in a suitable interposed measuring device (not illustrated in FIG. 1), e.g. a Phasor Measurement Unit (PMU), a Remote Terminal Unit (RTU) or a Merging Unit. Finally, the generated current phasor measured values are fed to an evaluation device, e.g. a CPU or a signal processor, of the respective differential protection device 12a, 12b.

The differential protection devices 12a and 12b are interconnected by means of a communication connection 16 which is indicated only schematically in FIG. 1 and may be, for example, an IP-based communication network or a telecommunication network. However, any other communication connection of any type can also be used to connect the differential protection devices 12a and 12b. The respective differential protection device 12a or 12b can be supplied via this communication connection 16 with the current phasor measured values from the respective other end 11a, 11b of the line 11, i.e. pairs of current phasor measured values recorded at both ends 11a and 11b can be formed in each case in each differential protection device 12a and 12b for each phase 13a, 13b, 13c of the line 11.

Using the current measured values from both ends 11a and 11b of the primary component 11 which are available in both differential protection devices 12a and 12b, a differential current value can be formed in one or both differential protection devices 12a and 12b by means of the evaluation device through vectorial addition of the current phasor measured values and subsequent absolute value formation for each phase, and can be compared with a threshold value.

In the case of a fault-free line 11, the current entering the line 11 for each phase is (more or less) equal to the current flowing from the line 11, so that a phasor with the absolute value of around zero should be obtained through vectorial addition of the current phasor measured values. However, in reality, the differential current value will always assume a value that is not equal to zero, but will be below a predefined threshold value. This can be attributed, for example, to a capacitive charging current on the monitored line, which causes the differential current value to virtually never permanently assume exactly the value zero, even in the fault-free case. In addition, transformer inaccuracies and measurement errors, for example, can also contribute to this effect. The predefined threshold value can be specified as either static or dynamic, for example adapted to the level of the respective phase currents.

The threshold value can be specified as a separate parameter. However, it can also be provided to check whether the threshold value has been exceeded by evaluating the position of a measured value pair consisting of the differential current value and an associated stabilization value in a tripping diagram. For this purpose, differential current values and associated stabilization values are formed from associated, i.e., simultaneously captured, current phasor measured values and the position of the measured value pair consisting of a differential current value and a stabilization value is checked in the tripping diagram. If the measured value pair is located within a tripping range, a fault affecting the monitored line is inferred and the fault signal is generated.

If the differential current value exceeds the predefined threshold value for a specific phase, this indicates a fault affecting the relevant phase of the line 11, which may, for example, be a short circuit to ground or a two-pole or multi-pole short circuit, i.e., a short circuit between two or more phases of the primary component. For that phase in which the fault has been detected, the differential protection devices 12a and 12b generate a fault signal, as a result of which the emission of a tripping signal is effected via control lines 17a, 17b to phase-selectively switchable circuit breakers 18 and 19. The tripping signal causes the corresponding phase-related circuit breaker 18a, 18b, 18c or 19a, 19b, 19c to open its switching contacts, so that the phase 13a, 13b, 13c affected by the fault is disconnected from the remainder of the power grid.

If, for example, a short circuit to ground occurs on the phase 13b, the differential protection devices 12a and 12b detect this on the basis of a differential current value exceeding the respective threshold value and transmit tripping signals to the phase-related circuit breakers 18b and 19b in order to disconnect the phase 13b of the line 11 from the power grid.

Although a three-phase line 11 with only two ends 11a and 11b is shown in FIG. 1, the method according to the invention can also be used with any single-phase or multi-phase lines with two or more ends, for example electrical busbars with a plurality of branches.

Furthermore, notwithstanding the illustration according to FIG. 1, it can also be provided that the current phasor measured values are transmitted to a single differential protection device and are evaluated there. In this case, it suffices to place measuring devices at the ends 11a, 11b of the line 11 to capture the current phasor measured values and transmit them to the differential protection device. This differential protection device could be disposed at one of the line ends, but also at any other position, for example as a central differential protection device in a switchgear station or control station or else in a data processing cloud.

In order to be able to determine the differential current value correctly, it is necessary for the current phasor measured values used for its formation to have actually been simultaneously captured at the ends 11a, 11b of the line 11. However, a time delay normally occurs, particularly when transmitting the current phasor measured values over a comparatively long communication route, so that the locally captured current phasor measured value cannot readily be linked to a current phasor measured value captured at a distant end and transmitted. If current phasor measured values that have not been simultaneously captured are used, differential current values may occur which exceed the threshold value and would therefore result in the emission of a fault signal, even in a line that is actually fault-free.

For the temporal allocation of the current phasor measured values, the latter are therefore normally provided with a marking in the form of a timestamp which indicates the time of their capture. By selecting those current phasor measured values from different ends of the line which have a matching timestamp, it can be ensured that the differential current value is calculated correctly. However, a prerequisite for this procedure is that the measuring devices used to capture the current phasor measured values in each case have local clocks or timers (CLK) which are synchronized with one another or at least have a known time delay. In order to achieve this, any time delay between the timers (CLK) of the respective measuring devices is continuously determined and is either used to readjust a timer (CLK) or is used by the evaluation device of the differential protection device for the temporal allocation of the current phasor measured values. In the last-mentioned case, for the temporal allocation of the current phasor measured values, the determined time delay must be subtracted from the timestamp of the current phasor measured value of that measuring device which has the timer with the time that is ahead of the other timer (CLK).

A transit-time-based synchronization method, for example the so-called "ping-pong method", can be used to determine the time delay between the timers (CLK) of the measuring devices. That time duration which is required to transmit a first message in one direction and then a second message in the other direction via the transmission route between the two measuring devices is measured here. In each case, the transmitted messages have a timestamp which indicates the time of their dispatch. The measuring devices furthermore record the reception time of the respective message. The time duration for the pure transmission of the messages (without any time delays between the reception of the first message and the dispatch of the second message) can be determined by means of the timestamps. The determined time duration is halved and provides the transit time on the communication route for a message transmitted in one transmission direction. The measuring devices can determine the time delay between the timers (CLK) of the measuring devices by means of the timestamps transmitted with the messages and the reception times and the transit time which is now known. Further details of the ping-pong method can be found in the above-mentioned patent No. U.S. Pat. No. 8,154,836 B2.

However, the determination of the time delay using a transit-time-based method can supply reliable results only if the communication route between the measuring devices is symmetrical, i.e. if the transit times of the messages for the forward path and the return path over the communication route are identical. In the case of an asymmetrical communication route, i.e. non-identical transit times for the forward path and the return path, the method supplies an incorrect transit time, so that the time delay determined using the transit time is also erroneous. In this case, current phasor measured values which are not simultaneously captured are erroneously used to calculate the differential current phasor value. In the worst case, this can result in the determination of a differential current phasor value which exceeds the threshold value despite an actually fault-free line.

It must therefore be ensured that an immediate detection takes place if a communication route is asymmetrical from the outset or changes, gradually or abruptly, from a symmetrical communication route to an asymmetrical communication route. For example, a previously symmetrical communication route can assume an asymmetrical behavior due to switching operations of switches or routers which modify the communication path of a message. Ageing effects or topology changes can also affect the behavior of a communication route.

According to the method proposed below, the occurrence of an asymmetrical behavior of a communication route or other circumstances distorting the transit time measurement can be comparatively easily detected. Only the current phasor measured values which are in any case present are required for this purpose.

As already described, in line differential protection, the current phasor measured values on overhead lines and cables with two or more ends are measured in a phase-selective manner and the vectorial sum of the current phasor measured values is then formed across all measuring stations. According to Kirchhoff's node rule, this sum must always be zero. This applies to the fault-free state of the line and likewise in the case of an external fault. If a fault occurs in the protection region (internal fault), that is to say on the line itself, differential currents which are not equal to zero arise. The line differential protection determines a fault on the basis of this criterion and transmits a tripping signal to a circuit breaker which disconnects the fault.

Figure 2:
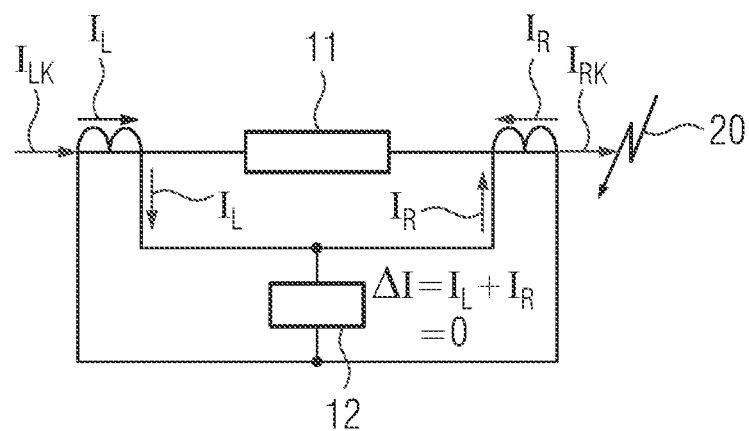
FIGS. 2 and 3 show a schematic view of a differential protection system in the case of an external fault and in the case of an internal fault.
Figure 3:
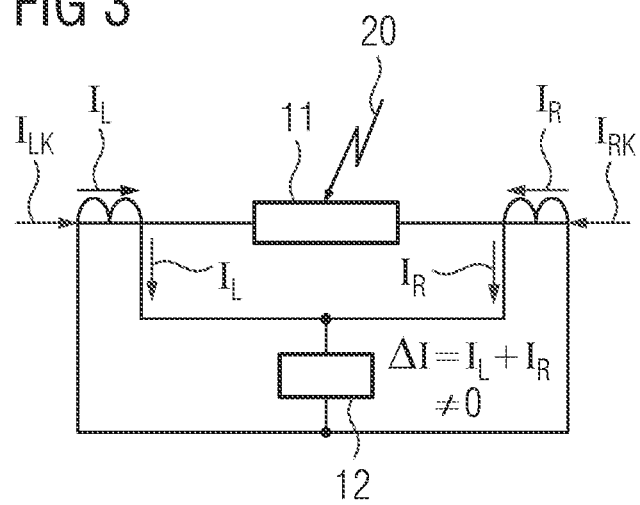

In this context, FIG. 2 shows the simplified single-phase basic circuit diagram of the differential protection for two ends of a line 11 for the case of an external fault, while FIG. 3 shows a corresponding basic circuit diagram for the case of an internal fault. The fault is indicated in each case by a lightning symbol 20. Only one differential protection device 12 is illustrated in a simplified manner in FIGS. 2 and 3. The indices L and R indicate the reference position. IL corresponds to the current phasor measured value at the local end of the line and IR corresponds to the current phasor measured value at the remote end of the line. It should be noted that currents which flow into the protection region are positively counted and currents flowing away are negatively counted. The short-circuit currents of the line are provided with the index K.

However, influences which result in a differential current value different from zero occur even during fault-free operation. These may be, for example, saturation phenomena of the current transformers, capacitive charging currents or asynchronous communication of the line. For this reason, a response value of zero cannot be accepted.

Figure 4:
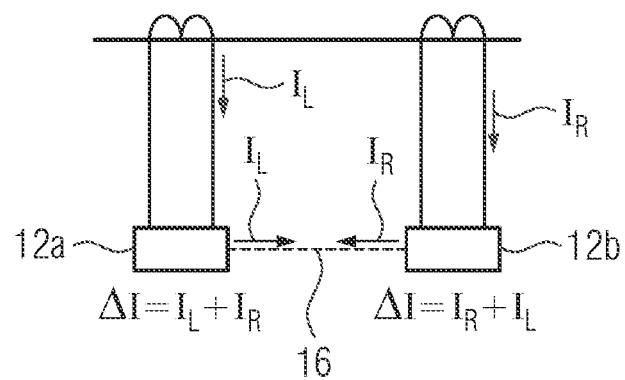
FIG. 4 shows a schematic view of a differential protection system for explaining the transmission of current phasor measured values.

For long lines, the current phasor measured values must be transmitted by means of serial communication, for example by means of optical waveguides. This is schematically indicated in FIG. 4 in which the differential protection devices 12a and 12b transmit their current phasor measured values IL and IR to the respective other differential protection device 12a, 12b via the communication connection 16. Alternatively, the transmission can also take place to only one of the differential protection devices 12a, b or to a central device.

Figure 5:
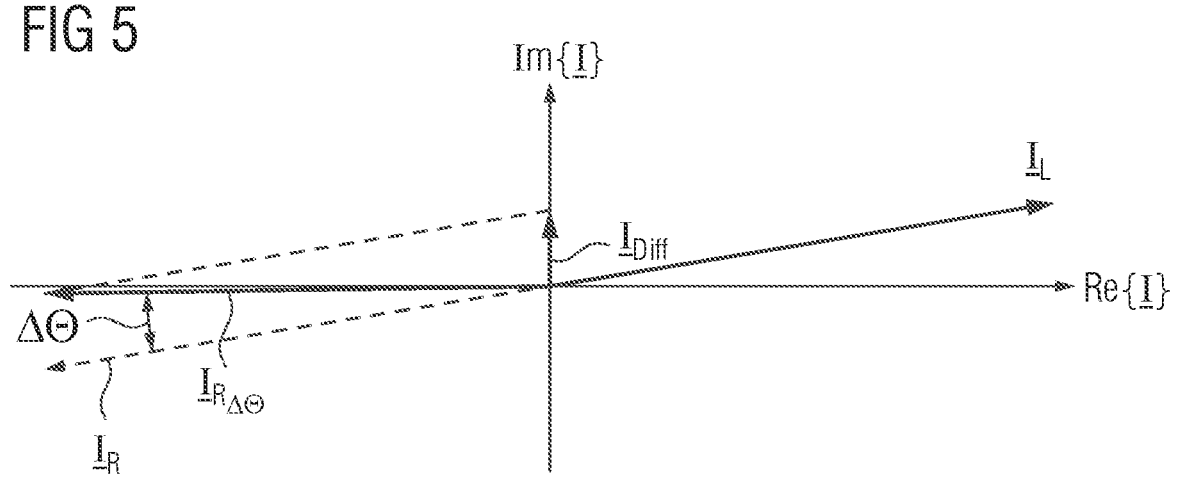
FIG. 5 shows a graph for explaining the emergence of an angular error as a result of a transit time difference when transmitting the current phasor measured values.

The so-called "ping-pong" method, for example, is used to synchronize the phasor values, but this presupposes identical transmission times tS1 for the forward path and tS2 for the return path (tS1=tS2). If differences (asymmetries) occur in the transit times, undesirable differential currents arise. The current phasor measured values IL and IR are rotated by an erroneous angle $\Delta\Theta$, as can be seen in FIG. 5 (IR$\Delta\Theta$ is entered as a rotated current phasor), with the result that an apparent differential current IDiff not equal to zero is also produced in the fault-free case. The resulting erroneous angle $\Delta\Theta$ and erroneous currents resulting therefrom are described above in connection with equations (1) to (3).

The aim is therefore to detect this interfering influence and to thereby monitor the method of operation of the differential protection. For this purpose, the complex current phasor measurement variables of the line ends are represented in a ratio with respect to one another in order to form an asymmetry variable AS. It is preferred in this case for the current phasor measured value with the smaller absolute value to be divided by the current phasor measured value with the larger absolute value. In the case of a line having two line ends, such a quotient would therefore be formed as follows:

$$AS = \frac{I_L}{I_R} \text{ for } |I_R| > |I_L| \text{ and } AS = \frac{I_R}{I_L} \text{ for } |I_L| > |I_R|$$

Ideally, that is to say without internal faults and interfering influences, the current phasor measured value at one end corresponds to the negative current phasor measured value at the other end. The asymmetry variable in the complex notation would therefore be:

$$AS = \frac{I_R}{I_L} = \frac{I_R}{-I_R} = -1 + 0j$$

Figure 6:
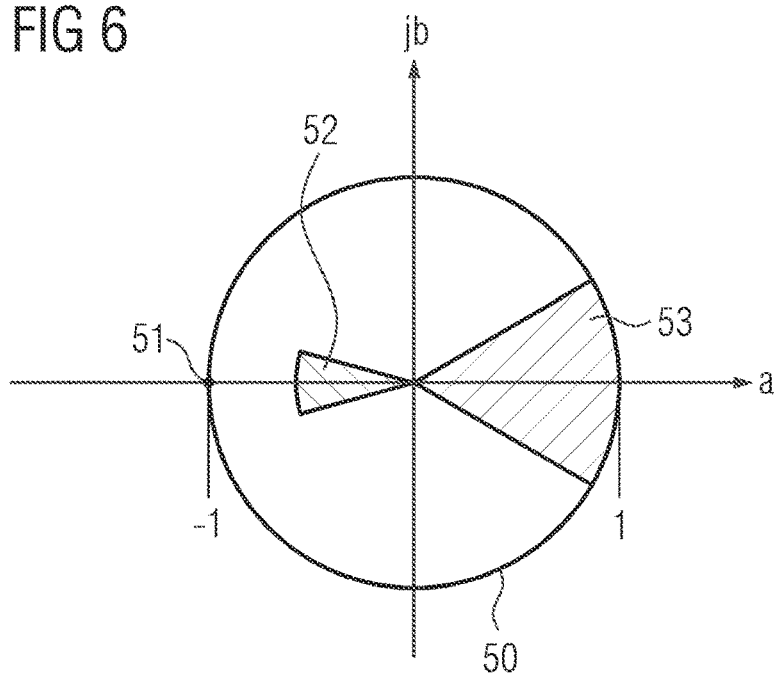
FIG. 6 shows a graph in the complex number plane for explaining the position of faulty and fault-free operating conditions.

The result can be represented in the complex number plane in a unit circle 50, as indicated in FIG. 6. Since the current phasor measured value with the smaller absolute value is always divided by the current phasor measured value with the larger absolute value, the asymmetry variable produced in this case cannot leave the unit circle 50. The ideal position of the asymmetry variable in the fault-free case (only electrical load) or in the case of external faults is indicated by point 51. This ideal position is also referred to as a reference operating point in the case of negligible capacitive charging currents. In this case IR=-IL. The regions of internal faults with single-ended supply (region 52) and with double-ended supply (region 53) are marked separately in the unit circle.

If asymmetries in the transit times of messages in different transmission directions of 2 and 4 ms occur in a 60 Hz grid, angular deviations of 21.6° and 43.2° arise starting from the reference operating point. The absolute values of the current phasor measured values do not change. In order to ensure symmetrical transit times, a monitoring function is therefore proposed, which monitoring function monitors the angular deviations or phase rotations in the case of constant absolute values of the current phasor measured values on the left-hand side of the unit circle. For example, the monitoring function can detect and accordingly report deviations of up to 6 ms. In order to ensure a tolerance with respect to absolute value deviations of the current phasor measured values, a range of, for example, 0.9<|AS|<1 can also be covered. An appropriately dimensioned monitoring region 61 is entered in a unit circle 60 in FIG. 7. The reference operating point of the asymmetry variable is indicated by 62. The monitoring of the transit times is active only within the monitoring region 61 (for example at points 63 and 64) and it is no longer possible to reliably distinguish between an actual fault and an excessive transit time difference outside said region (for example at point 65). Depending on the distance (in degrees) between the position of the asymmetry variable and the reference operating point, different levels of the urgency of a fault message can be generated.

In reality, in particular in the case of long lines, capacitive charging currents likewise result in angular errors. In addition, they cause errors in the current absolute values. The method of operation of the monitoring function can be restricted thereby. Capacitive charging currents Ic on overhead lines or cables can be determined as follows:

$$I_c = \frac{U_{LL}}{\sqrt{3}} \cdot 2\pi \cdot f_n \cdot C_b' \cdot l \quad (4)$$

where
$I_c$: charging current value to be determined;
$U_{LL}$: conductor-conductor voltage of the power grid;
$f_N$: nominal frequency of the power grid;
$C_b'$: capacitive coating of the line;
l: length of the line.

Figure 8:
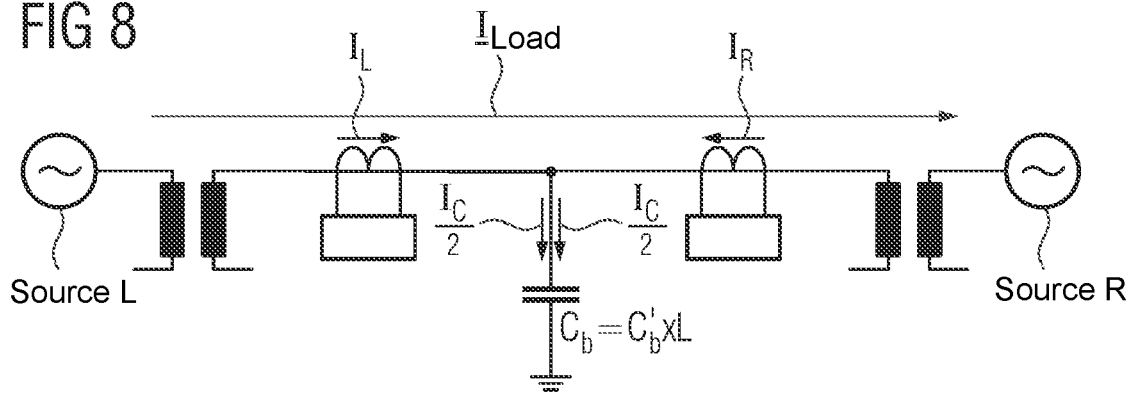
FIGS. 8 and 9 show circuit diagrams and graphs for explaining the influence of a capacitive charging current on the asymmetry variable.
Figure 8:
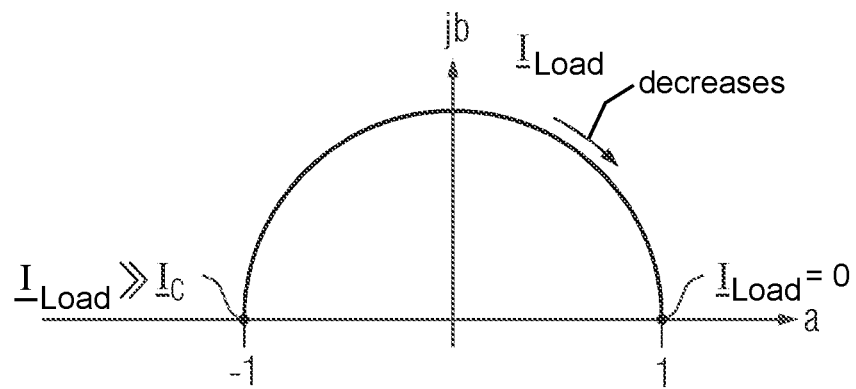

If the load current is low in comparison with the capacitive charging current, rotations with respect to the reference operating point may occur on the basis of the supply (single-ended, double-ended), as indicated, for example, in FIGS. 8 (double-ended supply) and 9 (single-ended supply). In this case, FIGS. 8 and 9 each show a basic circuit diagram of a differential protection system and, beside this, the effects of a shift of the reference operating point as a result of the capacitive charging current in the unit circle in the complex number plane.

Specifically, the rotation indicated in FIG. 8 results from the relationship represented in equation (5) in the case of double-ended supply:

$$AS = \frac{\underline{I}_R}{\underline{I}_L} = a + bj = \frac{-I_{Load} + \frac{\underline{I}_C}{2}}{I_{Load} + \frac{\underline{I}_C}{2}} \quad (5)$$

In the case of values of the capacitive charging current IC which are high in comparison with the load current Load, the value of equation (5) tends toward the value 1 and therefore the right-hand side of the unit circle. As shown in FIG. 6, the value of the asymmetry variable is also there, however, in the case of an actual fault, with the result that a clear statement cannot be made.

Figure 9:
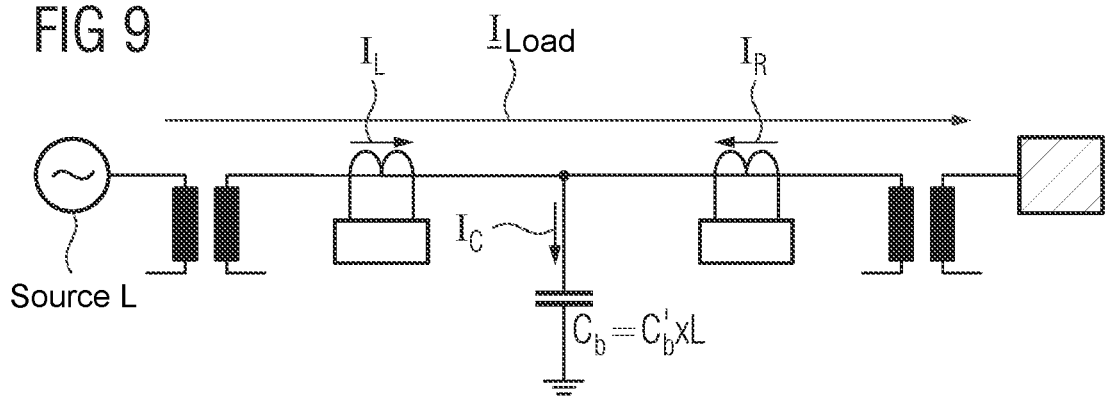
Figure 9:
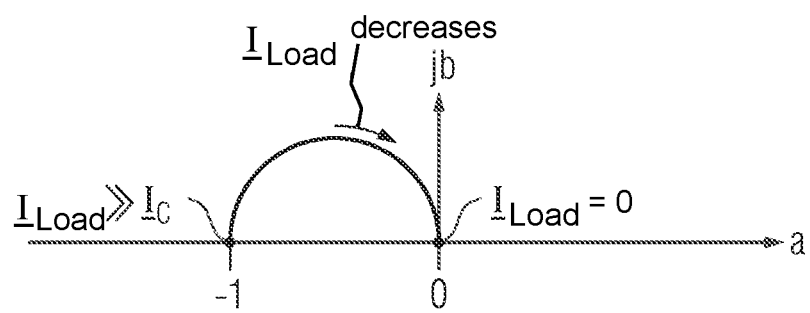

In addition, the rotation indicated in FIG. 9 results from the relationship represented in equation (6) in the case of single-ended supply:

$$AS = \frac{\underline{I}_R}{\underline{I}_L} = a + bj = \frac{-I_{Load}}{I_{Load} + \underline{I}_C} \quad (6)$$

In the case of values of the capacitive charging current IC which are high in comparison with the load current Load, the value of equation (6) tends toward the value 0 and therefore the center of the unit circle. As shown in FIG. 6, a clear statement is also not possible for this region of the unit circle.

As the result of the consideration, it can therefore be stated that the influence of the capacitive charging current increases with a falling load current and has the potential to shift the reference operating points to the coordinate origin or to the right-hand half-plane depending on the supply. Since it could be gathered from the previous consideration of the fault states in conjunction with FIG. 6 that the transit times of messages can be monitored only in the region of the left-hand half-plane of the unit circle without influencing the function of the differential protection, it can be determined that the transit times can be monitored only within particular ranges of the capacitive charging current.

For example, a minimum current threshold of the charging current in relation to the flowing load current should be complied with. If the absolute value of at least one of the current phasor measured values (either the local current phasor or the remote current phasor) is above a threshold value IS which results from the capacitive charging current multiplied by a factor x, the transit time monitoring is enabled:

Max($|\underline{I}_L|,|\underline{I}_R|$)>$I_s$, with $I_s=x\cdot|\underline{I}_C|$ A suitable value for x may be x=2.3, for example. This ensures that the influence of the charging current is low enough, such that the resulting reference operating point of the asymmetry variable still occurs in the left-hand half-plane of the unit circle in the fault-free case.

If the current phasor measured values therefore meet the condition stated above, and at least one of the absolute values of the current phasors is therefore more than 2.3 times the absolute value of the charging current, the monitoring function is enabled.

Figure 7:
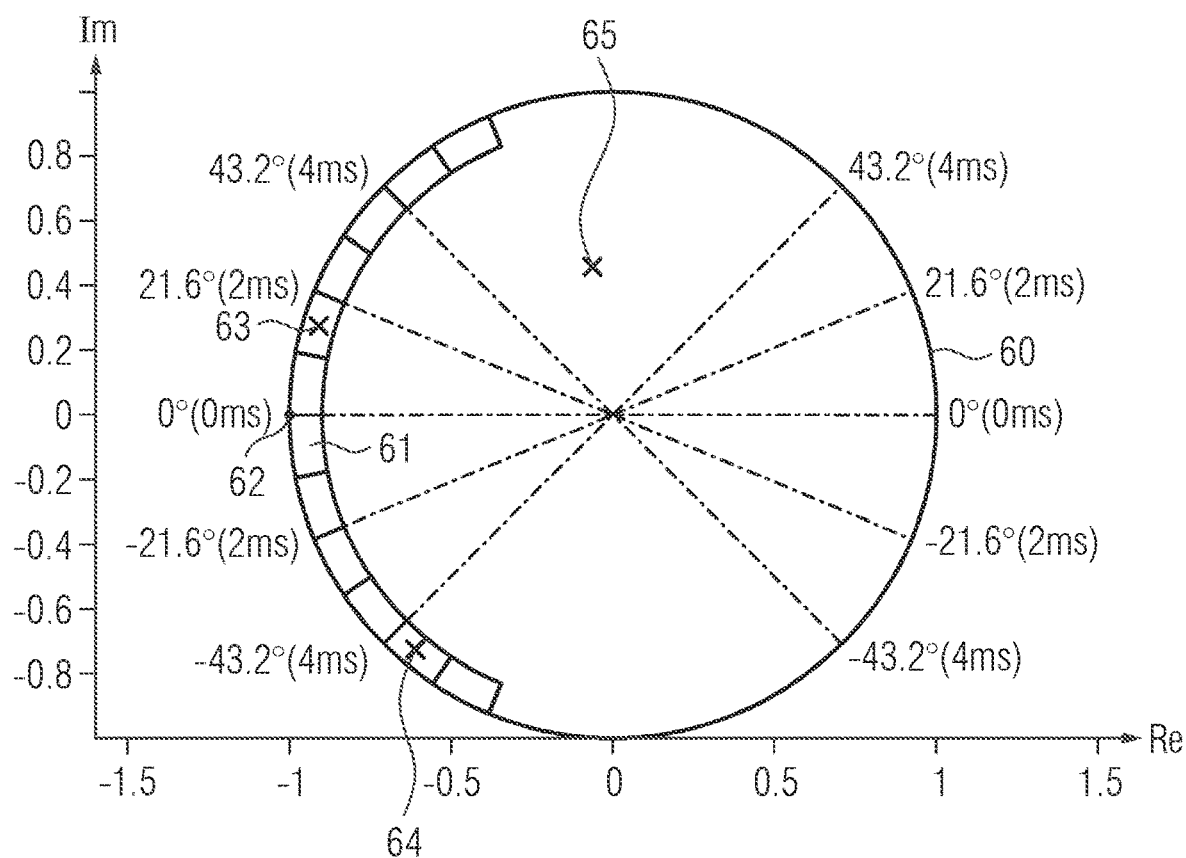
FIG. 7 shows a first graph for explaining the evaluation of an asymmetry variable.

In the case of this value, the maximum possible load-dependent (resistive, inductive or capacitive) angular deviation would be approximately 25.4° starting from the reference operating point without a capacitive charging current (FIG. 7). This ensures that the position of the asymmetry variable is in the left-hand half-plane irrespective of the connected load.

In order to make the method even more reliable, the ratio of the absolute values of the current phasor measured values in the fault-free case or in the case of external faults should also not be below a predefined minimum value, for example the value 0.56. This limit is illustrated, by way of example, as the left-hand edge of the fault region 52 in FIG. 6 and forms the limit value of the sensitivity of the differential protection in the case of internal single-pole faults with a high fault contact resistance.

In the case of external faults which result in a high current flow, the influence of the capacitive charging current falls in contrast. The exact determination of the charging current fails. In these cases too, the monitoring function should be deactivated. It appears to be useful to limit the operating range of the monitoring function to an upper value, for example 1.5 times the nominal current:

$|\underline{I}_L|\leq1.5\cdot I_N$ and $|\underline{I}_R|\leq1.5\cdot I_N$

Figure 10:
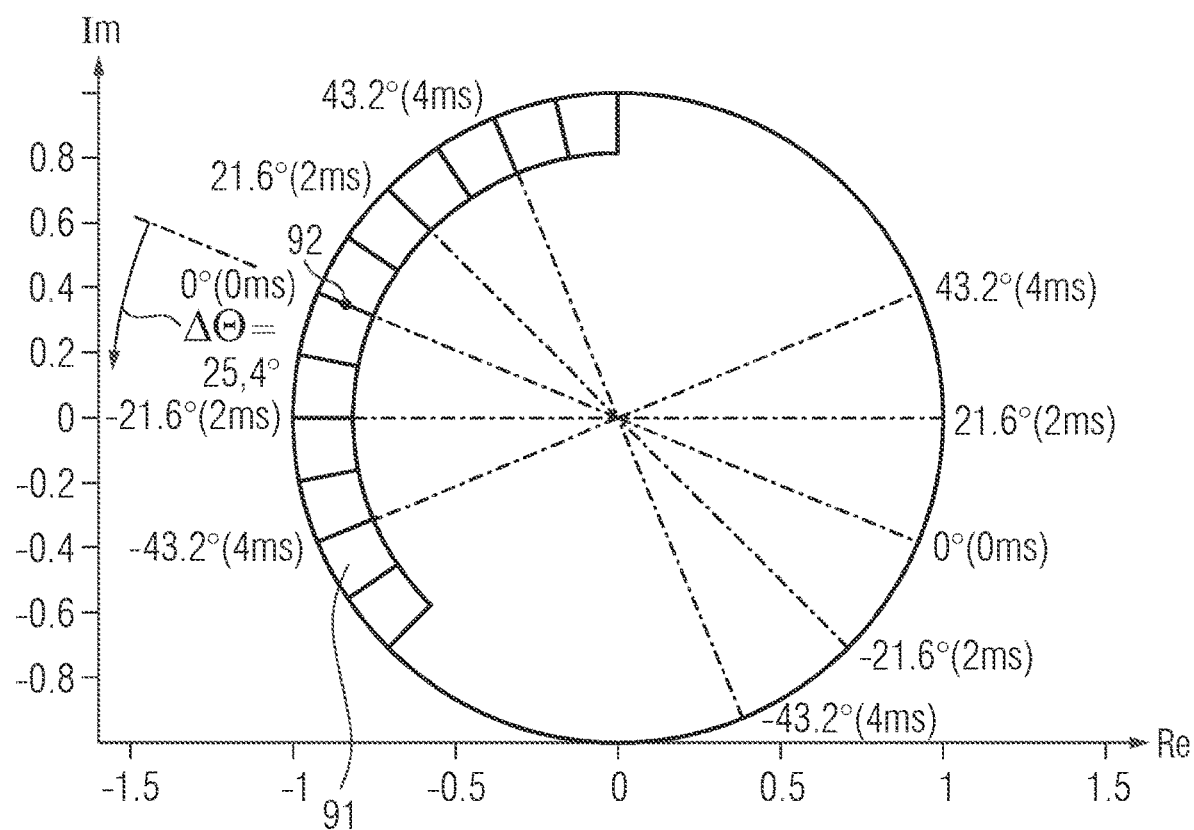
FIG. 10 shows a second graph for explaining the evaluation of the asymmetry variable, taking into account a capacitive charging current.

If load and line data are known, the level of the currents on the input and output sides can be calculated from the determined capacitive charging current calculated according to equation (4) from an appropriate grid model. It is then possible to determine the corresponding reference operating point therefrom under the influence of the capacitive charging current. The monitoring of the transit times takes into account the new reference operating point and accordingly adapts the monitoring region. In this respect, FIG. 10 shows a graph which corresponds to the illustration in FIG. 7 and has a monitoring region 91 which has been determined taking into account the capacitive charging current. Both the angular rotation and the absolute value of the reference operating point 92 have been shifted by the charging current in comparison with the reference operating point 62 in FIG. 7. The angular rotation of the reference operating point as a result of capacitive charging currents may be at most 25.4° in the example illustrated in FIG. 10. In addition, the tolerance of the absolute value differences for the asymmetry variable is extended to 0.8<|AS|<1. A tolerance of 10% in both directions is therefore still retained.

Overall, a functionality for monitoring the transit times of messages used for time synchronization via the communication connection is implemented here in parallel with the differential protection function. Monitoring the position of the asymmetry variable (angular deviation in degrees) based on a reference operating point makes it possible to directly infer asymmetrical communication (the asymmetry in ms can be determined from the phasor rotation in degrees). The indication of asymmetry which occurs is that the position of the asymmetry variable moves away from the known reference operating point by a particular angle for the fault-free case, but is still in the indicated monitoring region. This means that the absolute values of the current phasor measured values have not changed with respect to one another. The monitoring region can be subdivided in order to react differently for different distances between the asymmetry variable and the reference operating point. This is indicated in FIG. 11. The known unit circle 101 is shown in FIG. 11. The reference operating point 102 has been calculated for the case of an existing capacitive charging current. A monitoring region 100 defines the permitted operating range of the transit time monitoring. The monitoring function is blocked outside the monitoring region 100, in the region 107, in order not to allow any overlaps with actual faults.

Regions of different reaction to a deviation are depicted symmetrically around the reference operating point 102.

A normal region 103 indicates permitted deviations which do not need to result in a reaction. In regions 104 of low communication asymmetries (for example at 250 μs-500 μs), it is possible to transmit a message containing an indication of the existing slight asymmetry. In the case of stronger asymmetries (region 105, at 0.5 ms-2 ms), it is possible to provide a fault message which comprises a warning, and, in the case of excessively high asymmetry or in the case of asymmetries of more than 2 ms (region 106), the differential protection can be completely blocked.

If the monitoring region 100 is left, another fault is present. There is either actually an internal fault, to which the differential protection must respond, or there is a measurement error, for example in the case of current transformer saturation. In these cases, the monitoring function is deactivated.

The differential protection can be set to be more sensitive by additionally monitoring the transit times since transit time differences which can affect the time synchronization can now be detected directly and in terms of their level. Transit time changes may be detected irrespective of whether they are abrupt or gradual. As a result of the fact that the current phasor measured values are represented in relation to one another directly in the complex plane, absolute value and angular errors can be considered separately from one another. In the case of an internal fault, the monitoring functionality is deactivated since the position of the asymmetry variable moves away from the monitoring region.

Although the invention has been described and illustrated more specifically in detail above by means of preferred exemplary embodiments, the invention is not limited by the disclosed examples and other variations may be derived herefrom by a person skilled in the art without departing from the scope of protection of the patent claims set out below.

The invention claimed is:

1. A differential protection method for monitoring a line of a power grid, the method comprising:
    capturing current phasor measured values with measuring devices at respective ends of the line, the measured values indicating an amplitude and a phase angle of a phase current flowing at a respective end of the line, wherein the measuring devices include local timers and allocate a timestamp to the current phasor measured values indicating a time of a capture of the current phasor measure values;
    transmitting at least the current phasor measured values captured at one end via a communication connection to an evaluation device;
    forming a differential current value through vectorial addition by the evaluation device with current phasor measured values temporally allocated to one another;
    determining time delay information indicating a time delay between the local timers of the measuring devices with a transit-time-based time synchronization method and using the time delay information for temporally allocating the current phasor measured values captured at different ends of the line;
    forming a quotient of the current phasor measured values temporally allocated to one another to form an asymmetry variable, and using the asymmetry variable to check a transit time difference of messages transmitted via the communication connection, the transit time difference arising on account of transmission times that are different depending on the direction; and
    generating a fault signal indicating a fault affecting the line if the differential current value exceeds a predefined threshold value.

2. The differential protection method according to claim 1, which comprises forming the quotient by dividing the current phasor measured value with a smaller absolute value by a current phasor measured value with a larger absolute value.

3. The differential protection method according to claim 2, which comprises forming the asymmetry variable only when the quotient of the current phasor measured values exceeds a predefined minimum value.

4. The differential protection method according to claim 2, which comprises: analyzing a position of the asymmetry variable in a complex number plane; and inferring a presence of a transit time difference based on the position.

5. The differential protection method according to claim 4, which comprises generating a fault message on a basis of a distance between the position of the asymmetry variable and a reference operating point.

6. The differential protection method according to claim 5, which comprises blocking the generation of the fault message indicating a fault affecting the line when the distance between the position of the asymmetry variable and the reference operating point exceeds a maximum distance.

7. The differential protection method according to claim 5, which comprises determining the position of the reference operating point based on a capacitive charging current of the line.

8. The differential protection method according to claim 4, which comprises:
    defining a region, within which the position of the symmetry variable is allowed, in the complex number plane; and
    suspending the checking of the transit time difference if the asymmetry variable lies outside the defined region.

9. The differential protection method according to claim 1, which comprises forming the asymmetry variable only when the absolute value of at least one of the current phasor measured values exceeds a capacitive charging current of the line by a predefined factor.

10. The differential protection method according to claim 1, which comprises forming the asymmetry variable only when the absolute values of the current phasor measured values are below a threshold dependent on a nominal current of the power grid.

11. A differential protection device for monitoring a line of a power grid, the device comprising:
    a measuring device having a local timer and being configured to capture current phasor measured values at one end of the line, the values indicating an amplitude and a phase angle of a phase current flowing at the one end of the line, and to allocate a timestamp to the current phasor measured values indicating a time of a capture thereof;
    a communication device configured to exchange current phasor measured values via a communication connection with another differential protection device; and
    an evaluation device configured to form a differential current value with its own current phasor measured values temporally allocated to one another on the one hand, and current phasor measured values received from the other differential protection device on the other hand, through vectorial addition, wherein time delay information indicating a time delay between the local timers of the measuring devices of the differential protection devices is used for temporally allocating the current phasor measured values captured at different ends, wherein the time delay information is determined using a transit-time-based time synchronization method, and to generate a fault signal indicating a fault affecting the line if the differential current value exceeds a predefined threshold value;

wherein a quotient is formed of the current phasor measured values temporally allocated to one another, forming an asymmetry variable, and wherein the asymmetry variable is used to check a transit time difference of messages transmitted via the communication connection, the transit time difference arising on account of transmission times that are different depending on a direction.

12. A differential protection system for monitoring a line of a power grid, the system comprising:

at least two differential protection devices each disposed at a respective end of the line;

a communication connection connecting the individual said differential protection devices for a transmission of current phasor measured values;

each of said at least two differential protection devices including:

a measuring device having a local timer and being configured to capture current phasor measured values at a respective end of the line, the measured values indicating an amplitude and a phase angle of a phase current flowing at the respective end of the line, and to allocate a timestamp to the current measured values indicating the time of a capture thereof;

a communication device configured to exchange current phasor measured values via said communication connection with a respective other differential protection device;

at least one of said at least two differential protection devices including:

an evaluation device configured to form a differential current value with its own current phasor measured values temporally allocated to one another and current phasor measured values received from the respectively other differential protection device, through vectorial addition, wherein time delay information indicating the time delay between the local timers of said measuring devices of said differential protection devices is used for the temporal allocation of the current phasor measured values captured at different ends, wherein the time delay information is determined using a transit-time-based time synchronization method, and to generate a fault signal indicating a fault affecting the line if the differential current value exceeds a predefined threshold value; and wherein said at least one of said at least two differential protection devices is configured to form a quotient of the current phasor measured values temporally allocated to one another to form an asymmetry variable, the asymmetry variable being used to check a transit time difference of messages transmitted via the communication connection, which transit time difference arises on account of transmission times which are different depending on a direction of the transmission.

* * * * *